United States Patent
Abdelmoula et al.

(10) Patent No.: US 11,576,289 B2
(45) Date of Patent: Feb. 7, 2023

(54) ELECTROMAGNETIC PROTECTION SHEATH MADE OF TEXTILE

(75) Inventors: Rafik Abdelmoula, Nogent sur Oise (FR); Patrick Thomas, Crepy en Valois (FR); Lucia Della Putta, Venette (FR); Thierry Rodrigues, Ecouen (FR); Amelie Simoens, Compiegne (FR)

(73) Assignee: FEDERAL MOGUL SYSTEMS PROTECTION, Crepy en Valois (FR)

( * ) Notice: Subject to any disclaimer, the term of this patent is extended or adjusted under 35 U.S.C. 154(b) by 1367 days.

(21) Appl. No.: 12/599,099

(22) PCT Filed: May 7, 2008

(86) PCT No.: PCT/FR2008/000649
§ 371 (c)(1),
(2), (4) Date: Nov. 6, 2009

(87) PCT Pub. No.: WO2008/152243
PCT Pub. Date: Dec. 18, 2008

(65) Prior Publication Data
US 2010/0212952 A1    Aug. 26, 2010

(30) Foreign Application Priority Data
May 7, 2007 (FR) ........................ 0754917

(51) Int. Cl.
| | |
|---|---|
| *D03D 15/67* | (2021.01) |
| *H05K 9/00* | (2006.01) |
| *H01B 1/22* | (2006.01) |
| *H01B 1/02* | (2006.01) |
| *D03D 15/283* | (2021.01) |

(52) U.S. Cl.
CPC ......... *H05K 9/0098* (2013.01); *D03D 15/283* (2021.01); *D03D 15/67* (2021.01); *H01B 1/026* (2013.01); *H01B 1/22* (2013.01)

(58) Field of Classification Search
CPC ................................. H05K 9/00; D03D 15/67
USPC ................................ 442/5, 6, 228, 229, 301
See application file for complete search history.

(56) References Cited

U.S. PATENT DOCUMENTS 3,087,699 A * 4/1963 Foster .................. B21F 27/005
                                                    139/425 R
4,226,654 A * 10/1980 Young .................... B29D 30/42
                                                    152/512
4,631,098 A * 12/1986 Pithouse ............. B29C 61/0633
                                                    156/86

(Continued)

FOREIGN PATENT DOCUMENTS

| DE | 91 12 362 | 11/1991 |
|---|---|---|
| DE | 100 31 591 A1 | 1/2002 |

(Continued)

OTHER PUBLICATIONS

International Search Report dated Nov. 27, 2008, from corresponding PCT application.

*Primary Examiner* — Andrew T Piziali
(74) *Attorney, Agent, or Firm* — Nixon & Vanderhye

(57) ABSTRACT

An electromagnetic protection sheath made of textile (10) is formed by conductive filaments extending in a first direction (X) and non-conductive filaments interlaced with the conductive filaments. Use in particular for shielding cables in aeronautical applications.

19 Claims, 2 Drawing Sheets

(56) References Cited

U.S. PATENT DOCUMENTS

| | | | |
|---|---|---|---|
| 4,684,762 A | | 8/1987 | Gladfelter |
| 4,731,273 A | * | 3/1988 | Bonk .................. B29C 61/10 |
| | | | 428/57 |
| 4,754,685 A | * | 7/1988 | Kite .................. D04C 1/02 |
| | | | 87/9 |
| 4,791,236 A | | 12/1988 | Klein et al. |
| 4,929,803 A | * | 5/1990 | Yoshida et al. .......... 174/117 M |
| 4,946,722 A | | 8/1990 | Moyer |
| 5,168,006 A | * | 12/1992 | Inoguchi et al. ............. 442/187 |
| 5,209,964 A | | 5/1993 | Nakagawa |
| 5,739,471 A | | 4/1998 | Burisch |
| 6,222,126 B1 | * | 4/2001 | Strange et al. ............. 174/70 R |
| 6,333,736 B1 | * | 12/2001 | Sandbach ..................... 345/178 |
| 6,639,148 B2 | | 10/2003 | Marks |
| 6,963,031 B2 | * | 11/2005 | Gladfelter ................ F16L 3/26 |
| | | | 174/74 A |
| 2002/0195260 A1 | | 12/2002 | Marks |
| 2003/0211797 A1 | * | 11/2003 | Hill et al. .................... 442/205 |
| 2003/0221736 A1 | * | 12/2003 | Laurent et al. ............... 138/123 |
| 2006/0264137 A1 | | 11/2006 | Ishihara et al. |

FOREIGN PATENT DOCUMENTS

| | | |
|---|---|---|
| EP | 0153823 A2 | 9/1985 |
| EP | 1 367 601 A1 | 12/2003 |
| EP | 1348247 B1 | 12/2009 |
| FR | 2819092 A1 | 7/2002 |
| JP | H08-274488 A | 10/1996 |
| JP | H10-326525 A | 12/1998 |
| JP | H10-326526 A | 12/1998 |
| JP | H11-86642 A | 3/1999 |

\* cited by examiner

ELECTROMAGNETIC PROTECTION SHEATH MADE OF TEXTILE

BACKGROUND OF THE INVENTION

FIELD OF THE INVENTION

The present invention concerns an electromagnetic protection sheath made of textile.

It is generally concerned with the protection of electrical or other conductors from electromagnetic interference (EMI) by means of a sheath having shielding properties.

DESCRIPTION OF THE RELATED ART

A textile sheath is proposed in the document U.S. Pat. No. 4,684,762.

That sheath consists of a textile woven or braided from filaments in which only a portion of the fibers is conductive.

Thus there is known a textile sheath comprising warp threads formed of filaments comprising at least 20% to 80% by weight of conductive fibers and weft threads formed of filaments comprising a proportion between 1% and 20% by weight inclusive of conductive fibers.

Thus a sheath of this kind has conductive filaments both in the longitudinal direction and in the transverse direction, thus enabling electrical connections to be made at the crossings of the filaments in the electromagnetic shielding textile structure.

However, these sheaths including a high proportion of conductive metal remain relatively heavy, which is a particular problem in aerospace applications.

SUMMARY OF THE INVENTION

An object of the present invention is to provide a solution to the aforementioned drawback and thus to propose a lightweight electromagnetic protection sheath structure.

To this end, the present invention is aimed at a textile electromagnetic protection sheath, characterized in that the textile is formed of conductive filaments extending in a first direction and non-conductive filaments interlaced with said conductive filaments.

The Applicant found that it was possible to obtain an effective electromagnetic protection sheath without conductive filaments crossing over in the textile structure.

The conductive filaments of the structure are therefore not electrically connected together by interlaced filaments.

This textile structure including conductor filaments in only one direction lightens the sheath and furthermore makes it easier to fit thanks to the flexibility of the textile used.

According to a preferred feature of the invention, the first direction corresponds to a longitudinal direction of the sheath.

The conductive filaments therefore extend in the longitudinal direction of the sheath to provide effective electromagnetic protection of the cables covered by the sheath.

The non-conductive filaments advantageously include at least one thermoformable thread.

Thanks to the presence of a thermoformable thread, it is possible to obtain a self-closing protection sheath by heat treatment of the textile.

The sheath can therefore be produced from a flat textile that is then itself thermoformed to produce a tubular sheath.

In one practical embodiment of the invention, the textile is woven, the conductive filaments constituting warp threads and the non-conductive filaments constituting weft threads.

In another embodiment, the textile is braided, the conductive filaments extending in a longitudinal direction of the textile and the non-conductive filaments being braided in directions intersecting the longitudinal direction of the textile.

According to another advantageous feature of the invention, the non-conductive filaments have a diameter greater than the diameter of the conductive filaments so that they provide mechanical protection for the conductive filaments.

Thus the shielding properties of the sheath are not degraded even in the event of wear by rubbing of the sheath, this rubbing being limited to the non-conductive filaments of larger diameter.

Other features and advantages of the invention will become more apparent in the course of the following description.

BRIEF DESCRIPTION OF THE DRAWING FIGURES

In the appended drawings, provided by way of nonlimiting example:

DETAILED DESCRIPTION OF THE INVENTION

Figure 1:
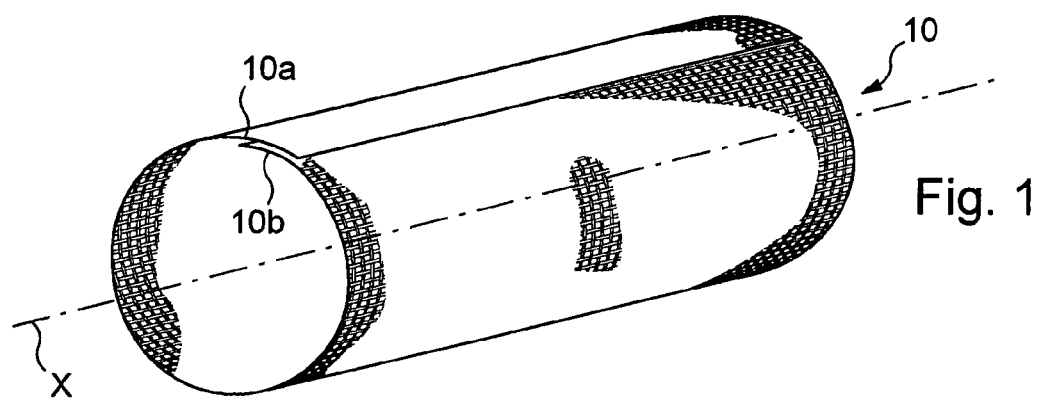
FIG. 1 is a diagrammatic perspective view of an electromagnetic protection sheath conforming to one embodiment of the invention.

FIG. 1 shows a textile electromagnetic protection sheath conforming to one embodiment of the invention.

In this embodiment of the invention, the protection sheath is produced from a textile formed flat which is then transformed into a tubular sheath by a thermoforming process.

This produces a longitudinally slit and self-closing tubular electromagnetic protection sheath 10 the longitudinal edges 10a, 10b of which have a larger or smaller overlap portion according to the diameter of the bundle of cables to which this electromagnetic protection sheath 10 is fitted.

This self-closing structure of the sheath facilitates fitting and retaining the sheath around a bundle of cables even when the latter bundle is connected at its ends.

It suffices to separate the longitudinal edges 10a, 10b to pass the sheath around a bundle of cables.

This structure enables addition of cables to the bundle and viewing of the cables during maintenance operations.

This sheath 10 is then closed with the edges 10a, 10b one against the other automatically by virtue of shape memory.

The textile used to produce this protection sheath of the invention can be of different kinds, for example produced by a weaving, braiding or knitting process.

Generally speaking, this textile is formed of filaments of two types:

on the one hand, conductive filaments that extend in a first direction, for example in the longitudinal direction X of the sheath 10 in the embodiment shown in FIG. 1; and on the other hand, non-conductive filaments interlaced with the conductive filaments.

These non-conductive filaments interlaced with the conductive filaments extend in directions intersecting (perpendicularly or otherwise) the conductive filaments that extend in the longitudinal direction X of the sheath.

In this embodiment, to provide the self-closing character of the sheath, these non-conductive filaments include at least one thermoformable thread.

More generally, the conductive filaments can consist of threads or fibers.

Any type of assembly of threads or fibers can be used, in particular in the form of a braid or woven or non-woven braided strip.

The conductive threads or fibers can be of metal or metalized.

The assembly of threads or fibers can therefore include metal threads or fibers, metalized threads or fibers or a mixture of metal and metalized threads or fibers.

The assemblies of threads or fibers include at least one portion of conductive threads or fibers.

The conductive filaments can therefore consist only of conductive threads or fibers or include only a portion of non-conductive threads or fibers.

For example, the conductive metal threads or fibers can be produced in copper or in any other conductive metal material.

The conductive threads or fibers can equally be produced from metalized non-conductive threads, i.e. threads coated with a conductive coating, for example of copper or silver.

ARACON® metalized polymer from du Pont de Nemours can be used, for example.

The conductive threads or fibers can equally be produced from polymer or elastomer material charged with conductive material particles or fibers.

The X-STATIC® material from Nobbelfiber can be used, for example.

Similarly, the non-conductive filaments can consist of thread or fiber, or an assembly, for example a braid or a braided woven or nonwoven strip, of non-conductive threads or fibers.

These non-conductive threads or fibers consist of mineral or synthetic fibers, for example, or a mixture of mineral and synthetic fibers.

The mineral fibers can be glass fibers, for example.

The non-conductive synthetic fibers can be formed in polyester, PPS (polyphenylenesulfide), PEEK (polyetheretherketone), polyamide, polyethylene, polypropylene, PEI (polyethyleneimine), PEK (polyetherketone) or PEKK (polyetherketoneketone).

These fibers have the advantage of being thermoformable.

Moreover, it is equally possible to use NOMEX® meta-aramide fibers or TEFLON® PTFE (polytetrafluoroethylene) fibers from du Pont de Nemours.

Figure 2:
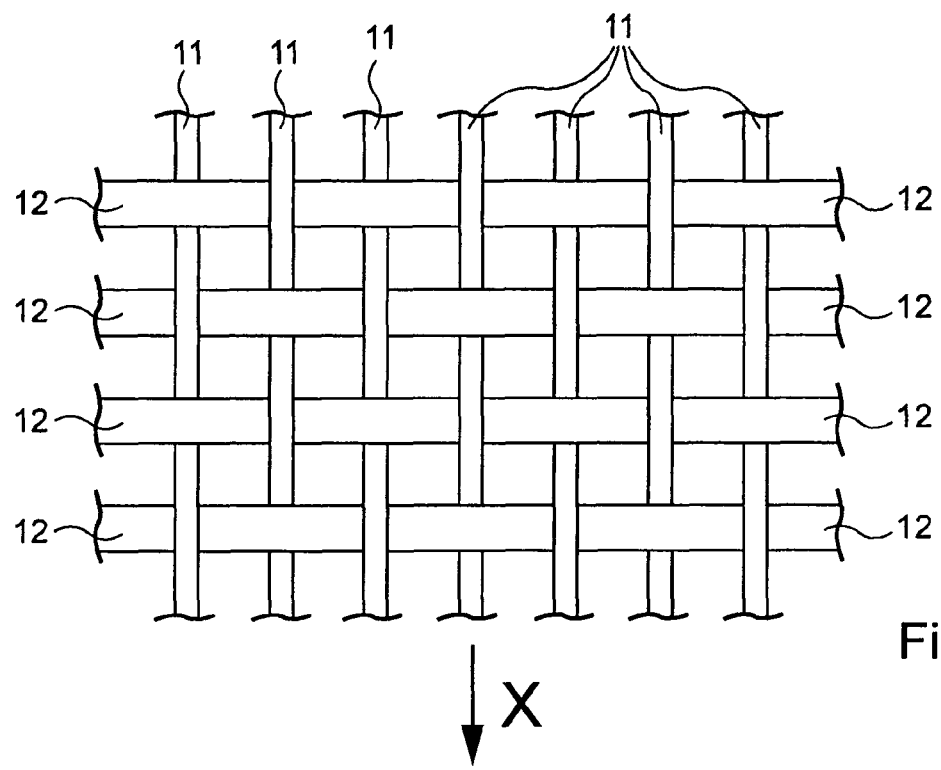
FIG. 2 is a diagram illustrating a textile of an electromagnetic protection sheath conforming to a first embodiment of the invention.

As shown in FIG. 2, one example of the textile is produced by weaving.

The conductive filaments 11 constitute the warp threads of the weave and extend in a longitudinal direction X.

The non-conductive filaments 12 constitute the weft threads of the weave and thus extend in a transverse direction substantially perpendicular to the longitudinal direction X.

In this example, the conductive filaments 11 can be produced from braided copper wire, for example, and the non-conductive filaments can be thermoformable PPS monofilaments.

The non-conductive filaments 12 preferably have a diameter greater than the diameter of the conductive filaments 11.

Thus wear of the sheath by rubbing or abrasion can be limited to the non-conductive filaments 12.

The shielding properties of the sheath can therefore be preserved even in the event of wear of the sheath by rubbing.

Figure 3:
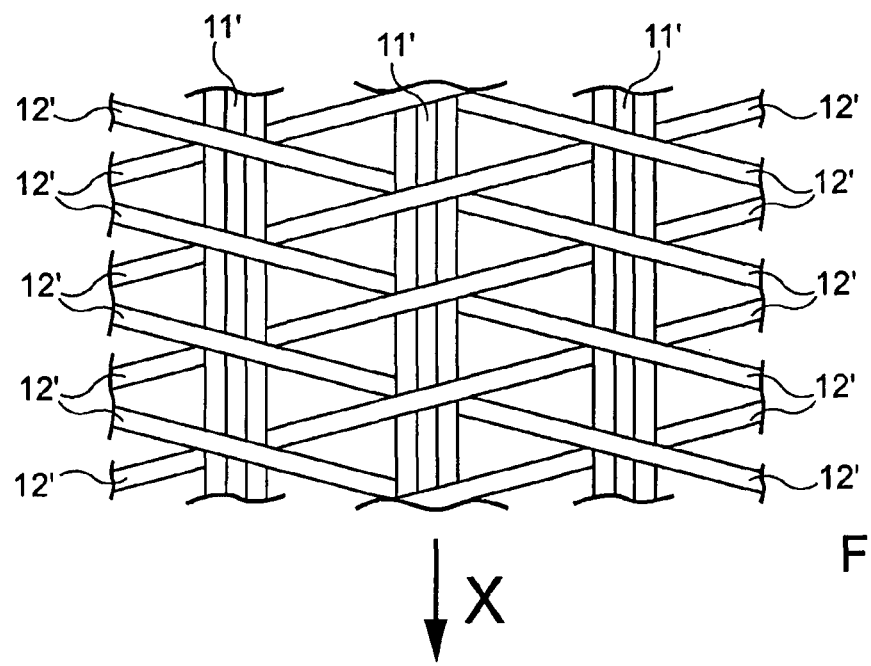
FIG. 3 is a diagram illustrating a textile of an electromagnetic protection sheath conforming to a second embodiment of the invention.

FIG. 3 shows a second embodiment of a textile.

The textile is produced by braiding.

The conductive filaments 11' extend in a longitudinal direction X of the braided textile.

The non-conductive filaments 12' are braided in directions intersecting the longitudinal direction X of the textile.

They are therefore braided around the conductive filaments 11' and produce the interlaced structure of the textile.

In this embodiment, and in a manner that is in no way limiting on the invention, the conductive filaments 11' consist of braided copper wire.

The non-conductive filaments 12' consist of a thermoformable PPS thread.

Of course other types of conductive and non-conductive materials or filaments can be used.

It will be noted that in the two embodiments described above the textile structure does not have crossing conductive filaments where the filaments cross.

The electromagnetic protection nevertheless remains effective provided that the conductive filaments extend parallel to each other in a first direction, in this embodiment in the longitudinal direction of the sheath.

Thanks to the use of non-conductive filaments in the other directions of the sheath, it is possible to limit the weight of the sheath and to give it satisfactory flexibility.

This type of electromagnetic protection sheath, being relatively light in weight, is particularly well suited to aerospace applications, for protecting bundles of cables in aircraft.

Thanks to the use of a thermoformable thread, the textile structure can be produced flat, by weaving or braiding, and then subjected to heat treatment at a temperature of more than 200° C. to deform the thermoformable thread in the substantially transverse direction of the sheath, which thus becomes self-closing.

Of course, the sheath 10 need not be self-closing and could instead include closure means on its longitudinal edges 10a, 10b.

Figure 4:
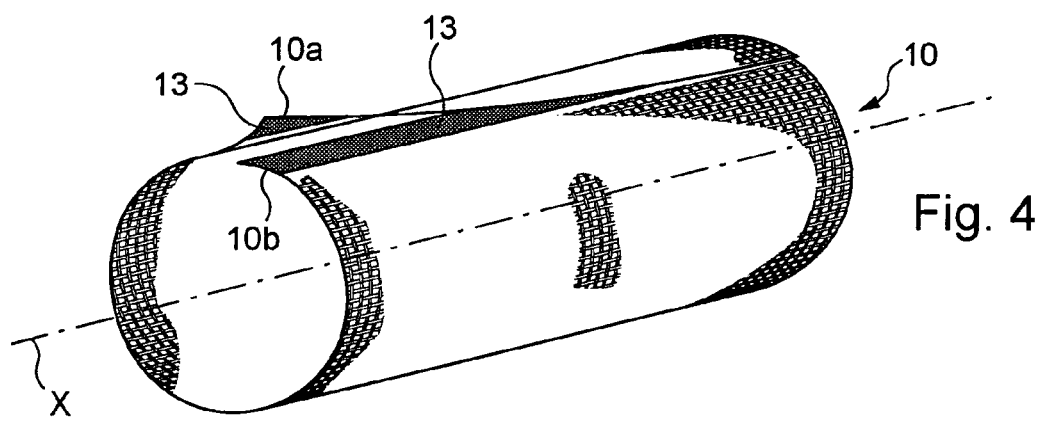
FIG. 4 is a view analogous to FIG. 1 showing another embodiment of the invention.

As shown in FIG. 4, self-gripping closure means 13 of the VELCRO® tape type can be provided on an interior face of a longitudinal edge 10a and an exterior face of a longitudinal edge 10b of sheath 10 for closing the sheath around a bundle of cables.

The sheath 10 can also have self-closing properties thanks to a different thermoforming treatment.

For example, cold pressing of a sheath woven flat and folded in half can impart a shape memory structure to the sheath.

Such a sheath can therefore return to its closed shape to cover a bundle of cables after it is placed around the bundle of cables.

Of course, the present invention is not limited to the embodiments described above.

In particular, the electromagnetic protection sheath could equally be produced by knitting it.

Similarly, the electromagnetic protection sheath could be produced directly in the form of a closed tubular sheath by an appropriate weaving, braiding or knitting technique.

The invention claimed is:

1. A textile electromagnetic protection sheath, comprising:

conductive filaments extending in a first direction corresponding to a longitudinal direction of the sheath between opposite ends of the sheath, the conductive filaments being formed from wires such that the conductive filaments protect against external electromagnetic signals; and non-conductive filaments interlaced with said conductive filaments, wherein the sheath is a self-closing longitudinally slit sheath biased into having opposite overlapping longitudinal edges in an overlapping relation with one another at an overlapped region, wherein said non-conductive filaments extend substantially transversely to said conductive filaments between the opposite longitudinal edges and include at least one thermoformable thread that is heat-treatable such that the sheath closes by the at least one thermoformable thread providing a biasing force that keeps the longitudinal edges in the overlapping relation with one another, the at least one thermoformable thread having a diameter greater than a diameter of the conductive filaments, and wherein the longitudinal edges are configured to be separated away from one another against the biasing force in response to application of an external separation force to facilitate assembly of the sheath about a cable to be protected and to facilitate viewing of the cable during maintenance, and to automatically return the longitudinal edges into the overlapping relation with one another under the biasing force upon removal of the external separation force.

2. The electromagnetic protection sheath according to claim 1, wherein the sheath is a longitudinally slit sheath including self-gripping closure means on the longitudinal edges of said sheath.

3. The electromagnetic protection sheath according to claim 1, wherein the sheath is a longitudinally slit sheath having a shape memory.

4. The electromagnetic protection sheath according to claim 1, wherein the sheath is a closed tubular sheath.

5. The electromagnetic protection sheath according to claim 1, wherein the textile is woven, said conductive filaments constituting warp threads and said non-conductive filaments constituting weft threads.

6. The electromagnetic protection sheath according to claim 1, wherein the textile is a braid, the conductive filaments extending in a longitudinal direction of the textile and the non-conductive filaments being braided in directions intersecting said longitudinal direction of the textile.

7. The electromagnetic protection sheath according to claim 1, wherein the non-conductive filaments are formed from a polyphenylenesulfide thread.

8. The electromagnetic protection sheath according to claim 1, wherein the sheath is a longitudinally slit sheath including self-gripping closure on a longitudinal edges of said sheath.

9. The electromagnetic protection sheath according to claim 1, wherein the sheath is a longitudinally slit sheath having a shape memory.

10. The electromagnetic protection sheath according to claim 1, wherein the non-conductive filaments are formed from mineral fibers, glass fibers or synthetic fibers selected from the group consisting of polyester, polyphenylenesulfide, polyetheretherketone, polyamide, polyethylene, polypropylene, polyethyleneimine, polyetherketone, polyetherketoneketone, meta-aramide and polytetrafluoroethylene.

11. The electromagnetic protection sheath according to claim 1, wherein the conductive filaments are not electrically connected together by interlaced filaments.

12. The electromagnetic protection sheath according to claim 1, wherein the thermoformable thread is formed from at least one selected from the group consisting of polyester, polyphenylenesulfide, polyetheretherketone, polyamide, polyethylene, polypropylene, polyethyleneimine, polyetherketone, polyetherketoneketone, and polytetrafluoroethylene.

13. The textile electromagnetic protection sheath according to claim 1, wherein the sheath is configured with a longitudinal opening defined therethrough in a state in which the sheath is closed, the sheath being configured to receive the cable within the longitudinal opening, and the sheath is configured to electromagnetically protect the cable when the cable is disposed within the longitudinal opening.

14. The textile electromagnetic protection sheath according to claim 1, wherein at least some of said conductive filaments are discrete bundles of braided wires.

15. The textile electromagnetic protection sheath according to claim 14, wherein said conductive filaments are copper.

16. A textile electromagnetic protection sheath, consisting essentially of:

conductive filaments extending in a first direction corresponding to a longitudinal direction of the sheath between opposite ends of the sheath, the conductive filaments being formed from wires such that the conductive filaments protect against external electromagnetic signals; and thermoformable non-conductive filaments interlaced with said conductive filaments, the thermoformable non-conductive filaments extending between opposite longitudinal edges of the sheath such that said conductive filaments are thereby mutually insulated from each other, wherein the non-conductive filaments have a diameter greater than a diameter of the conductive filaments so that wear of the sheath by rubbing or abrasion is limited to the non-conductive filaments, wherein the sheath is a self-closing longitudinally slit sheath biased into having opposite overlapping longitudinal edges in an overlapping relation with one another at an overlapped region, the thermoformable non-conductive filaments closing the sheath by the thermoformable non-conductive filaments providing a biasing force that keeps the longitudinal edges in the overlapping relation with one another, and wherein the longitudinal edges are configured to be separated away from one another against the biasing force in response to application of an external separation force to facilitate assembly of the sheath about a cable to be protected and to facilitate viewing of the cable during maintenance, and to automatically return the longitudinal edges into overlapping relation with one another under the biasing force upon removal of the external separation force.

17. The electromagnetic protection sheath according to claim 16, wherein the textile is woven, said conductive filaments constituting warp threads extending along the longitudinal direction and said non-conductive filaments constituting weft threads extending transversely to the longitudinal direction.

18. The textile electromagnetic protection sheath according to claim 16, wherein at least some of said conductive filaments are discrete bundles of braided wires.

19. The textile electromagnetic protection sheath according to claim 18, wherein said conductive filaments are copper.

\* \* \* \* \*